US010825975B2

(12) United States Patent
Ikeda

(10) Patent No.: US 10,825,975 B2
(45) Date of Patent: Nov. 3, 2020

(54) SEMICONDUCTOR LIGHT-EMITTING DEVICE HAVING GAP BETWEEN THERMALLY-CONDUCTIVE FILM AND METAL CORE AND METHOD FOR PRODUCING SAME

(71) Applicant: STANLEY ELECTRIC CO., LTD., Tokyo (JP)

(72) Inventor: Kenji Ikeda, Tokyo (JP)

(73) Assignee: STANLEY ELECTRIC CO., LTD., Tokyo (JP)

(*) Notice: Subject to any disclaimer, the term of this patent is extended or adjusted under 35 U.S.C. 154(b) by 54 days.

(21) Appl. No.: 16/229,423

(22) Filed: Dec. 21, 2018

(65) Prior Publication Data
US 2019/0198737 A1 Jun. 27, 2019

(30) Foreign Application Priority Data
Dec. 22, 2017 (JP) .................. 2017-245938

(51) Int. Cl.
*H01L 33/64* (2010.01)
*H01L 33/00* (2010.01)
*H01L 33/62* (2010.01)

(52) U.S. Cl.
CPC .......... *H01L 33/642* (2013.01); *H01L 33/005* (2013.01); *H01L 33/62* (2013.01); *H01L 33/641* (2013.01); *H01L 2933/0075* (2013.01)

(58) Field of Classification Search
CPC ..... H01L 33/642; H01L 33/005; H01L 33/62; H01L 33/641; H01L 2933/0075; H01L 33/64; H01L 33/00; H01L 2224/48091; H01L 2924/00014

USPC .......................................................... 257/99
See application file for complete search history.

(56) References Cited

U.S. PATENT DOCUMENTS

| | | | | |
|---|---|---|---|---|
| 9,249,530 | B2* | 2/2016 | Yoon | D03D 1/00 |
| 2008/0128739 | A1* | 6/2008 | Sanpei | H05K 1/0203 |
| | | | | 257/99 |
| 2008/0258164 | A1* | 10/2008 | Masui | H01L 33/507 |
| | | | | 257/98 |
| 2010/0001298 | A1* | 1/2010 | Hsieh | H01L 33/486 |
| | | | | 257/88 |
| 2011/0024785 | A1* | 2/2011 | Ng | H01L 33/642 |
| | | | | 257/99 |

(Continued)

FOREIGN PATENT DOCUMENTS

JP      H08-236886 A      9/1996

*Primary Examiner* — Alexander O Williams
(74) *Attorney, Agent, or Firm* — Xsensus LLP

(57) ABSTRACT

A semiconductor light-emitting device capable of suppressing the influence of thermal expansion on a light-emitting element during operation of the device and improving light-emitting characteristics is provided. The semiconductor light-emitting device includes: a substrate having a through hole, a metal core fitted into the through hole via a resin layer and penetrating through the substrate; a thermally-conductive film formed in the region of the upper surface of the metal core and having a flat surface; and a semiconductor light-emitting element bonded to the flat surface of the thermally-conductive film with an adhesive layer interposed therebetween. The outer edge of the thermally-conductive film is separated from the outer edge of the upper surface of the metal core.

19 Claims, 7 Drawing Sheets

(56) References Cited

U.S. PATENT DOCUMENTS

| | | | |
|---|---|---|---|
| 2011/0169037 A1* | 7/2011 | Hasegawa | H01L 33/642 257/98 |
| 2011/0311831 A1* | 12/2011 | Suzuki | H05K 1/0204 428/457 |
| 2011/0316034 A1* | 12/2011 | Doan | H01L 33/62 257/99 |
| 2012/0311856 A1* | 12/2012 | Yoshimura | H01L 33/62 29/829 |
| 2013/0020606 A1* | 1/2013 | Han | H05K 1/0203 257/99 |
| 2013/0026529 A1* | 1/2013 | Tsang | H01L 33/642 257/99 |
| 2013/0214298 A1* | 8/2013 | Lin | H01L 33/56 257/88 |
| 2015/0111327 A1* | 4/2015 | Yang | H01L 24/24 438/27 |

* cited by examiner

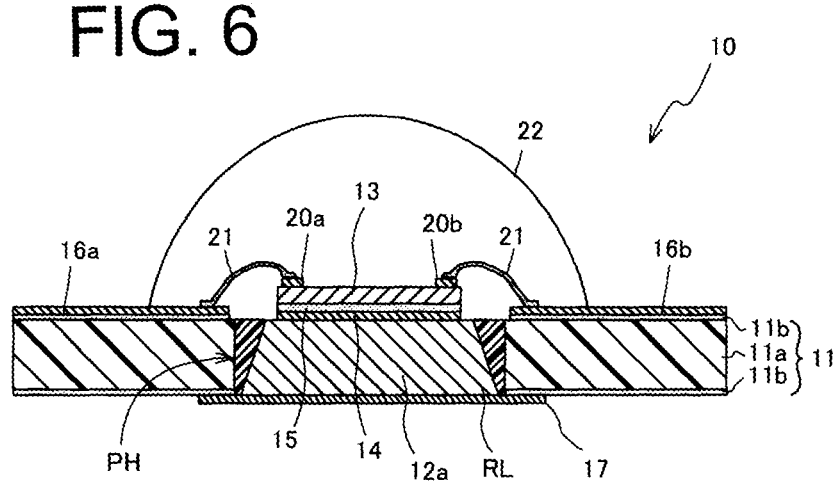
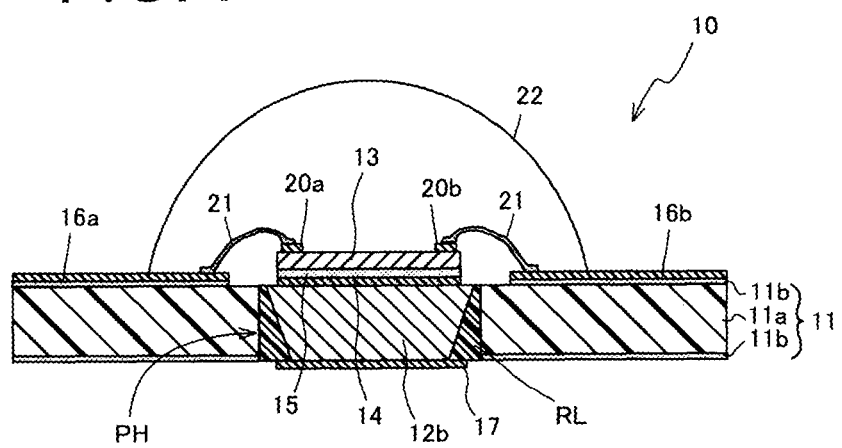

SEMICONDUCTOR LIGHT-EMITTING DEVICE HAVING GAP BETWEEN THERMALLY-CONDUCTIVE FILM AND METAL CORE AND METHOD FOR PRODUCING SAME

This application claims the priority benefit under 35 U.S.C. § 119 of Japanese Patent Application No. 2017-245938 filed on Dec. 22, 2017, which is hereby incorporated in its entirety by reference.

TECHNICAL FIELD

The presently disclosed subject matter relates to a semiconductor light-emitting device including a semiconductor light-emitting element, and a method for producing the same.

BACKGROUND ART

In recent years, the use of infrared light-emitting diodes (LEDs) in semiconductor light-emitting devices has been expanding. Infrared LEDs are increasingly combined with infrared cameras that emit infrared rays and capture images by CMOS cameras with infrared filters. Infrared cameras are also used in rear camera systems to assist parking operation of vehicles. By using infrared rays, it is possible to obtain a clear image not only in the nighttime but also even in the daytime without being influenced by the ambient brightness. Therefore, high power is required for recent infrared LEDs.

On the other hand, in the field of metal-based copper-clad laminates for mounting electronic components such as power modules, LSIs, passive elements, and the like, a technique for enhancing heat dissipation properties of generated heat from circuit elements to be mounted is known (see, for example, Japanese Patent Application Laid-Open No. Hei. 8-236886).

However, in Japanese Patent Application Laid-Open No. Hei. 8-236886 which discloses a metal-based copper clad laminate for enhancing the heat dissipation properties of heat generated from circuit elements, although attention is paid to increasing the mounting density of the circuit elements, there are no description relating to positional deviation of each circuit element at the time of mounting and no description relating to influence of thermal expansion on the circuit elements at the time of operation.

SUMMARY

The presently disclosed subject matter was devised in view of these and other problems and features in association with the conventional art. According to an aspect of the presently disclosed subject matter, a semiconductor light-emitting device capable of suppressing the influence of thermal expansion on a light-emitting element during operation of the device and improving light-emitting characteristics, and a method for producing the same.

According to another aspect of the presently disclosed subject matter, a semiconductor light-emitting device includes:
a substrate;
a metal core fitted into a through hole formed in the substrate via a resin layer and penetrating through the substrate;
a thermally-conductive film formed in the region of the upper surface of the metal core and having a flat surface; and
a semiconductor light-emitting element bonded to the flat surface of the thermally-conductive film with an adhesive layer interposed therebetween, wherein
the outer edge of the thermally-conductive film is separated from the outer edge of the upper surface of the metal core.

According to still another aspect of the presently disclosed subject matter, a method for producing a semiconductor light-emitting device includes:
a through hole forming step of forming a through hole in a substrate;
a fitting step of fitting and fixing a metal core to the through hole via a resin layer;
a patterning step of forming a thermally-conductive film in a region of the upper surface of the metal core, the thermally-conductive film having a flat surface; and
a bonding step of bonding a semiconductor light-emitting element to the flat surface of the thermally-conductive film.

BRIEF DESCRIPTION OF DRAWINGS

These and other characteristics, features, and advantages of the presently disclosed subject matter will become clear from the following description with reference to the accompanying drawings, wherein:

FIG. 6 is a schematic cross-sectional view of a modification of the semiconductor light-emitting device according to the exemplary embodiment of the presently disclosed subject matter;

FIG. 7 is a schematic cross-sectional view of another modification of the semiconductor light-emitting device according to the exemplary embodiment of the presently disclosed subject matter;

DESCRIPTION OF EXEMPLARY EMBODIMENTS

Figure 1:
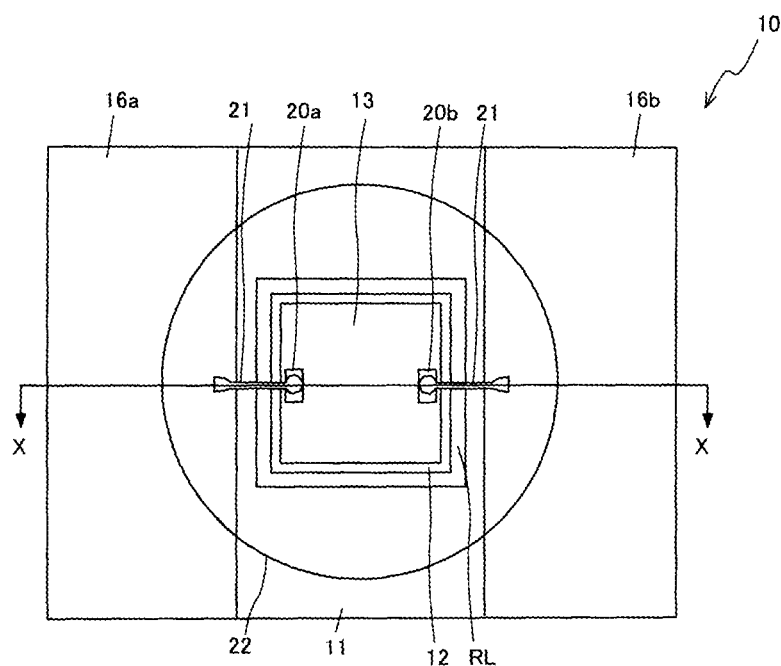
FIG. 1 is a schematic top view of a semiconductor light-emitting device according to an exemplary embodiment made in accordance with principles of the presently disclosed subject matter.

A description will now be made below to semiconductor light-emitting devices and the production method therefor of the presently disclosed subject matter with reference to the accompanying drawings in accordance with exemplary embodiments. Hereinafter, the same components are denoted by the same reference numerals, and detailed descriptions of the same components will be omitted.

Figure 2:
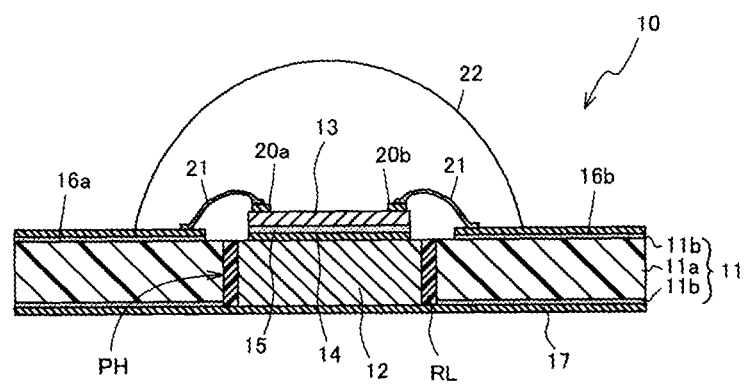
FIG. 2 is a schematic cross-sectional view of the semiconductor light-emitting device cut along line X-X in FIG. 1.

Semiconductor Light-Emitting Device:

FIG. 1 is a schematic top view of a semiconductor light-emitting device 10 according to an exemplary embodiment of the presently disclosed subject matter which will be simply referred to as "light-emitting device", and FIG. 2 is a schematic cross-sectional view of the semiconductor light-emitting device 10 taken along line X-X in FIG. 1.

Figure 3:
FIG. 3 is a cross-sectional view of a substrate of the semiconductor light-emitting device according to the exemplary embodiment of the presently disclosed subject matter.

As shown in FIGS. 1 and 2, the light-emitting device 10 includes a substrate 11, a metal core 12, and a semiconductor light-emitting element 13 mounted on the metal core 12. A cross-sectional view illustrating only the substrate 11 is shown in FIG. 3, and a cross-sectional view illustrating only the metal core 12 is shown in FIG. 4.

The substrate 11 is a double-sided copper-clad laminated substrate comprising, for example, a base material 11a and copper foils 11b applied to both main surfaces (upper and lower surfaces) of the base material 11a. Examples of the base material 11a used may include a glass epoxy substrate and a substrate made of a ceramic material such as alumina and AlN. In the following description, a surface facing in the same direction as the upper surface (above in the drawing) of the substrate 11 will be referred to as an upper surface, and a surface facing in a direction opposite to the upper surface (below in the drawing) will be referred to as a lower surface.

The metal core 12 is fitted to a through hole PH (see FIG. 3), which has been formed therein, from the upper surface thereof to the substrate 11 with a resin layer RL interposed therebetween. Specifically, the metal core 12 penetrates the substrate 11 and is fixed by the resin layer RL. The metal core 12 is made of a metal such as copper or aluminum. Examples of the resin constituting the resin layer RL may include synthetic resins such as a silicone resin, an epoxy resin, an acrylic resin, and a polycarbonate resin.

Figure 4:
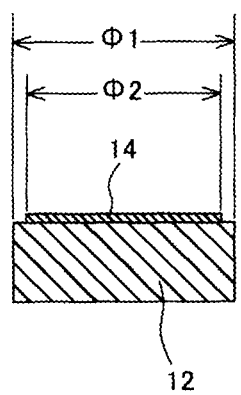
FIG. 4 is a cross-sectional view of a metal core of the semiconductor light-emitting device according to the exemplary embodiment of the presently disclosed subject matter.

As shown in FIG. 4, a thermally-conductive film 14 is formed on the upper surface of the metal core 12. The thermally-conductive film 14 is formed of a film made of a metal material such as copper. The thermally-conductive film 14 has a flat surface (upper surface) having an area $\phi 2$ smaller than the area $\phi 1$ of the region of the upper surface of the metal core 12. The thermally-conductive film 14 is formed within the region of the upper surface of the metal core 12 so as not to protrude from the region of the upper surface of the metal core 12. Therefore, the thermally-conductive film 14 is disposed so that the outer edge of the thermally-conductive film 14 is separated from the outer edge of the upper surface of the metal core 12 and a gap is maintained therebetween. The thermally-conductive film 14 formed as a separate member may be bonded or formed in the region of the upper surface of the metal core 12, or may be formed of the same material as the material of the metal core 12 in an integral manner.

As shown in FIGS. 1 and 2, a light-emitting element 13 is bonded and thus mounted on the substrate 11, on which the thermally-conductive film 14 is formed on the upper surface thereof, via an adhesive layer 15 on the upper surface of the thermally-conductive film 14. The light-emitting element 13 may have a lower surface having substantially the same shape as the flat surface of the thermally-conductive film 14. The size of the light-emitting element 13 is not limited as long as the lower surface of the light-emitting element 13 is bonded to the flat surface of the thermally-conductive film 14 with the adhesive layer 15 interposed therebetween.

Examples of the material for the adhesive layer 15 in the form of an uncured adhesive may include bonding materials such as an Ag paste, a sintered material, and an AuSn eutectic material. In order to efficiently transfer heat to the thermally-conductive film 14 and the metal core 12, it is preferable to use an electroconductive bonding material as the material for the adhesive layer 15.

The lower surface of the light-emitting element 13 may have a shape similar to that of the region of the flat surface of the upper surface of the thermally-conductive film 14 or a shape including the same shape in part of the outline. Therefore in the step of heating and melting the adhesive such as the eclectic material present between the light-emitting element 13 and the thermally-conductive film 14, the light-emitting element 13 can be joined to a predetermined position on the thermally-conductive film 14 with high accuracy by the self-alignment effect. Further, the thermally-conductive film 14 is formed of a metal material having good solder wettability such as Au, or the surface of the thermally-conductive film 14 is formed of a metal material having good solder wettability such as Au by means of plating or the like. Therefore, it is possible to further improve the accuracy of self-alignment at the time of eutectic bonding.

When the adhesive layer 15 is formed by an Ag paste, the curing temperature of the uncured adhesive is 200° C. or lower, and because of its low melting point the influence of stress due to the thermal expansion of the substrate 11 and the resin layer RL at the time of curing (until the completion of curing) is about "moderate". In the case of using an Ag paste, the area of the thermally-conductive film 14 can be set larger than that in the case of using a sintered material or an AuSn eutectic material.

When the adhesive layer 15 is formed of a sintered material, the curing temperature of the uncured adhesive is 250° C. or lower, and because of the medium melting point of the uncured adhesive, the influence of the stress due to the thermal expansion of the substrate 11 and the resin layer RL at the tune of curing (until the completion of curing) is about "large". Examples of the sintered material used may include an Ag sintered material, and an Au sintered material.

When the adhesive layer 15 is formed of an AuSn eutectic material, the curing temperature of the uncured adhesive is as high as 280° C., and because of the high melting point of the uncured adhesive, the influence of the stress due to the thermal expansion of the substrate 11 and the resin layer RL at the time of curing (until the completion of curing) is about "excessively large". In this embodiment, an AuSn eutectic material is used as the adhesive.

Examples of the adhesive for used in the adhesive layer 15 may include, in addition to the AuSn eutectic, alloy materials such as Sn—Ag-based, Sn—Cu-based. Sn—Sb-based, and Sn—Sb—Ag-based materials, in the form of a solder paste or an alloy bump.

As shown in FIGS. 1 and 2, a p-connection electrode 16a and an n-connection electrode 16b formed by plating a metal such as Cu are provided on the upper surface of the substrate 11, and a heat dissipation film 17 in contact with the metal core 12 is provided on the lower surface of the substrate 11. The heat dissipation film 17 can be used as a soldering pattern. The heat dissipation film 17 may be provided over the entire lower surface of the substrate 11, but may be provided in a limited area around the lower surface of the metal core 12 depending on the circuit design.

The p-connection electrode 16a and the n-connection electrode 16b are formed on the upper surface (copper foil 11b) of the substrate 11. The p-connection electrode 16a and the n-connection electrode 16b are formed apart from each other on the surface of the substrate 11 without the copper foil with the through hole PH (FIG. 3) interposed therebetween, thereby being insulated from each other.

The light-emitting device 13 is, for example, a 1 mm-square LED chip formed by slacking GaAs-based semiconductor layers (not shown) such as AlGaAsP including a light-emitting layer. The semiconductor layer is formed by crystal growth of a semiconductor material by epitaxial growth or the like. The light-emitting layer of the light-emitting element 13 emits infrared light having a center of an emission wavelength exceeding about 700 nm, for example. As the light-emitting element 13, for example, an LED chip having another emission wavelength such as visible light may be used, and not limited to an LED chip, another light-emitting element such as an LD chip may also be used.

A p-side pad electrode 20a and an n-side pad electrode 20b are provided on the upper surface of the light-emitting element 13. The p-side pad electrode 20a and the n-side pad electrode 20b are formed of an electroconductive material such as Au. The p-side pad electrode 20a and the p-connection electrode 16a are connected by wire bonding using a conductive wire 21 such as Au wire. The n-side pad electrode 20b and the n-connection electrode 16b are also connected by wire bonding using an electroconductive wire 21 such as Au wire.

As shown in FIGS. 1 and 2, a sealing body 22 transparent to the light emitted from the light-emitting element 13 is formed on (over) the upper surface of the light-emitting element 13.

The sealing body 22 is formed of a translucent resin such as a silicone resin filled on the light-emitting element 13. That is, the light-emitting element 13 and the bonding wire 21 are buried by the sealing body 22. The upper surface of the sealing body 22 serves as a light emitting surface of the light-emitting device 10. The sealing body 22 is formed by dropping or applying an uncured translucent resin onto the upper surface of the light-emitting element 13, and then curing and drying the resin. The sealing body 22 may be formed in a dome shape on the upper surface of the light-emitting element 13. The sealing body 22 may have a structure in which the thickness of the central portion is thicker than that of the peripheral portion. The sealing body 22 is preferably formed so as to cover the entire light-emitting element 13. Examples of the material for the light-transmissive sealing body 22 may include, in addition to a silicone resin, synthetic resins such as an epoxy resin, an acrylic resin, and a polycarbonate resin.

Method for Producing Semiconductor Light-Emitting Device:

Main steps of an example of a method for producing the semiconductor light-emitting device will be described with reference to the drawings.

First, a double-sided copper-clad laminated substrate 11 composed of a base material 11a and copper foils 11b adhered to both main surfaces thereof is prepared.

Figure 5A:
FIGS. 5A to 5D are each a schematic cross-sectional view for each of steps of a method for producing the semiconductor light-emitting device according to the exemplary embodiment of the presently disclosed subject matter.

In the through hole forming step, as shown in FIG. 5A, a square through hole PH is formed in the substrate 11 when viewed in a top view (first step).

Figure 5B:
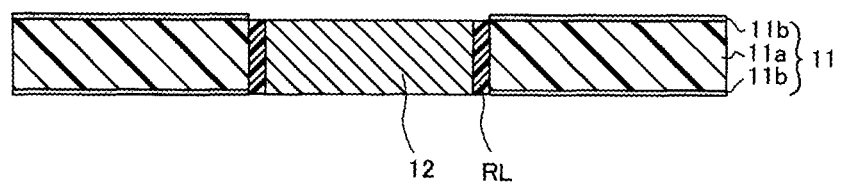

In the fitting step, as shown in FIG. 5B, the metal core 12 is fitted and fixed to the through hole PH via the resin layer RL (second step). That is, the metal core 12 is inserted into the through hole PH, and a specific uncured resin is filled in a gap between the substrate 11 and the metal core 12, and is cured to fix the metal core 12 to the substrate 11 by the resin layer RL. In filling the uncured resin, a prepreg (not shown) may be used.

Figure 5C:
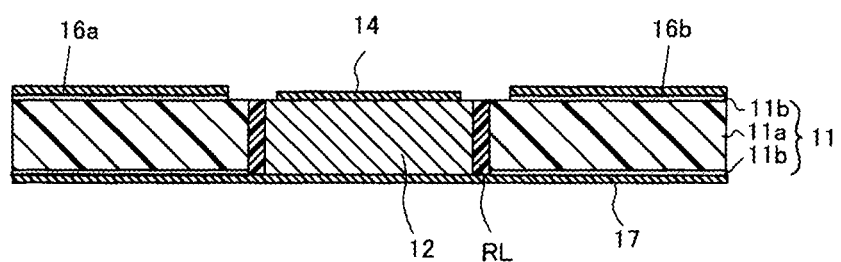

In the pattern forming step, as shown in FIG. 5C, a thermally-conductive film 14 having a flat surface (upper surface) having an area smaller than the region of the upper surface of the metal core 12 is formed (third step). Here, both surfaces of the substrate 11 to which the metal core 12 is fixed are subjected to plating, for example, Cu plating. The plating may be performed on both surfaces of the substrate 11, the metal core 12, and the resin layer RL. Then, the plating is subjected to an etching process to form circuits such as the p-connection electrode 16a, the n-connection electrode 16b, the thermally-conductive film 14, and the heat dissipation film 17. Then, a specific portion on the circuit is again subjected to a plating process, for example, Ni/Au plating. Thus, the p-connection electrode 16a, the n-connection electrode 16b, the heat dissipation film 17, and the like are completed.

Figure 5D:
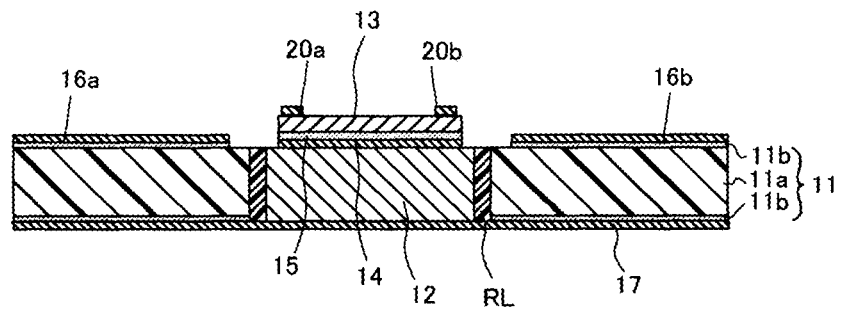

In the bonding step, as shown in FIG. 5D, the light-emitting element 13 is placed on and bonded to the flat surface of the thermally-conductive film 14 (fourth step). Here, an uncured adhesive (e.g., an AuSn paste (not shown)) is applied onto the thermally-conductive film 14 of the substrate 11, and then the light-emitting elements 13 are sequentially mounted on the uncured adhesive by a mounter device (not shown). In this state, the entire assembly is heated together with the uncured adhesive. At this time, self-alignment of the light-emitting element 13 is performed by the melted uncured adhesive and the thermally-conductive film 14. That is, the light-emitting element 13 moves in a direction, in which the center of the lower surface of the light-emitting element 13 and the center of the thermally-conductive film 14 overlap each other, due to the surface tension of the melted uncured adhesive so that the lower surface of the light-emitting element 13 faces the corresponding thermally-conductive film 14 in the horizontal direction (front, rear, left and right). When the shape and size of the lower surface of the light-emitting element and the thermally-conductive film 14 are the same, the lower surface of the light-emitting element 13 is moved to coincide on the thermal conductive film 14. After self-alignment of the light-emitting element 13 is carried out by the melted uncured adhesive, the assembly is cooled and the alloy component of the uncured adhesive is cured to form the adhesive layer 15 to achieve eutectic bonding. After bonding, the edge of the lower surface of the light-emitting element 13 is separated from the peripheral edge of the upper surface of the metal core 12 by the total thickness of the thermally-conductive film 14 and the adhesive layer 15. The outer edge of the thermally-conductive film 14 is formed away from the outer edge of the metal core 12. As a result, since the edge of the lower surface of the light-emitting element 13 is separated from the resin layer RL, the edge is not affected by the stress distortion of the resin layer RL due to the thermal expansion during the operation of the device. In particular, there is no possibility that the lower surface of the light-emitting element 13 is pushed up by the thermally expanded resin layer RL.

In this manner, in the bonding step, the lower surface of the light-emitting element 13 is bonded to the flat surface of the thermally-conductive film 14 via the adhesive layer 15.

Although the melted adhesive is restricted from flowing out at the outer edge of the thermally-conductive film, the melted adhesive may be allowed to flow out onto the metal core 12 to the extent that the melted adhesive does not reach the resin layer RL. In this case, the outer edge of the adhesive layer 15 is on the metal core 12, but does not reach the outer edge of the metal core 12.

Next, although not illustrated, a known wire bonding process is performed between the upper surface of the light-emitting element 13 and the wiring of the substrate 11 (p-connection electrode 16*a*, n-connection electrode 16*b*) after the cleaning process.

Next, although not illustrated, in the sealing body disposing step, a predetermined amount of a light transmissive uncured sealing material is applied onto the upper surface of the light-emitting element 13 and cured. Through the above production steps, the light-emitting device 10 illustrated in FIG. 1 can be obtained.

Effects of Semiconductor Light-Emitting Device and Production Method Thereof:

(1) Stress on the light-emitting element 13 due to thermal expansion of the resin layer RL during operation of the semiconductor light-emitting device can be reduced, and reliability of the device can be enhanced. The light-emitting element 13 is in the region of the thermally-conductive film 14 of the metal core 12 and neither the substrate 11 nor the resin layer RL is present directly below the light-emitting element 13 with respect to the horizontal direction of the substrate 11, and thus, the light-emitting element 13 is subjected to stress of only the thermal expansion of the metal core 12, but the stress applied to the light-emitting element 13 is constant and no distortion occurs regardless of the location within the region. Therefore, in the light-emitting element 13, stress breakdown due to thermal expansion of the resin layer RL or the substrate 11 during driving or in an environment does not occur so that reliability of the semiconductor light-emitting device can be improved and light-emitting characteristics can be maintained.

(2) No positional deviation occurs at the time of bonding during producing of the light-emitting element 13. Since the light-emitting element 13 and the thermally-conductive film 14 have the same size, the light-emitting element 13 is held within the region of the thermally-conductive film 14 by alignment correction when the uncured adhesive is melted in the bonding process. The lower surface of the light-emitting element 13 and the thermally-conductive film 14 are not limited to the same shape and the same size. They may have similar shapes, and the lower solace of the light-emitting element 13 may be smaller than the thermally-conductive film 14. In these cases, a case where the outer edge of the thermally-conductive film 14 does not partially coincide with that of the light-emitting element 13 is also included.

(3) The deviation of the thermally-conductive film 14 at the time of etching can be taken into consideration. Since the area of the upper surface region of the metal core 12 is sufficiently large compared to the area of the thermally-conductive film 14, even when a deviation of the thermally-conductive film 14 occurs, the thermally-conductive film 14 will fall within the metal core 12.

(4) The heat dissipation efficiency can be unproved and the cost can be reduced. Use of the metal core 12 can achieve a high heat dissipation efficiency as compared with a configuration in which a conductive paste is filled in the through hole. Further, use of the metal core 12 can reduce the cost as compared with the filling of the through hole with the fill plating.

Modifications (1) The metal core 12 may have a rectangular shape or a circular shape when viewed from above. In the case of a cylindrical metal core, it is easier to form a metal core compared with a prism metal core, and a reduction in cost may be expected. In the case of a prismatic metal core having a rectangular shape in top view, the metal core 12 can be matched with the rectangular shape of the light-emitting element 13 as shown in FIG. 1. Thus, the size of the metal core becomes the minimum necessary size, and the effect of increasing the degree of freedom in circuit formation can be obtained.

(2) The shape of the through hole when viewed from above may be circular or square. In the case of a circular hole, compared with the case of a square hole, it becomes easier to produce, and a reduction in cost may be expected. In the case of the square hole, as illustrated in FIG. 1, it is possible to match the shape of the through hole with the square shape of the light-emitting element 13, the size of the through hole PH is minimized, and the effect of increasing the degree of freedom in the circuit formation can be obtained.

(3) The metal core 12 may have a columnar shape or a frustum shape with the normal line of the main surface of the substrate 11 as the center axis. That is, in the light-emitting device described above, the shape of the cross section perpendicular to the upper surface and the lower surface of the metal core 12 can be a rectangle or a shape extending or narrowing from the upper surface toward the lower surface. In the case of a metal core having a square cross section, the metal core shape is easily formed, and a reduction in cost may be expected. In addition, as illustrated in FIG. 6, when the cross-sectional shape of the metal core 12*a* is trapezoidal, that is, frustum-shaped, the area of the lower surface of the metal core 12 is enlarged, and so the heat dissipation property at the time of light emission of the light-emitting element 13 is improved. Further, as illustrated in FIG. 7, when the cross-sectional shape of the metal core 12*b* is trapezoidal (upwardly widened), the soldering pattern (heat dissipation film 17) on the lower surface of the metal core 12 can be minimized, so that the mounting pattern can be reduced, and the product deviation after the mounting reflow can be reduced. In either case, by making the side surface of the metal core 12 in contact with the adhesive layer 15 inclined, the metal core 12 is hardly pulled out of the substrate 11.

Figure 8:
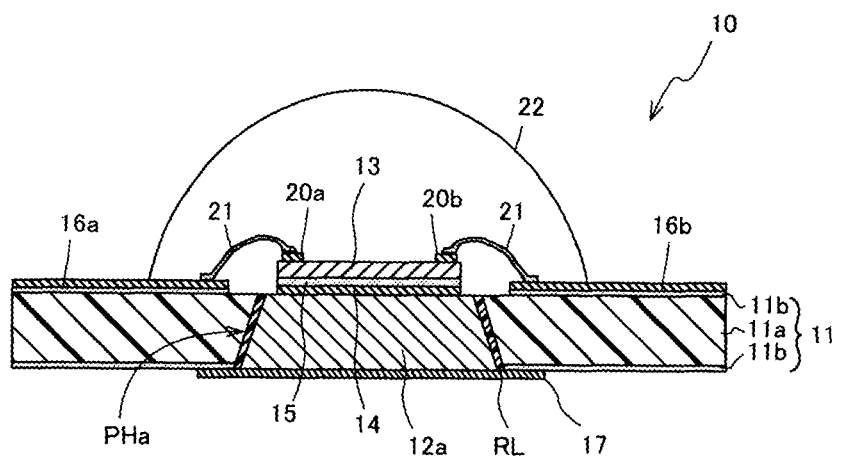
FIG. 8 is a schematic cross-sectional view of still another modification of the semiconductor light-emitting device according to the exemplary embodiment of the presently disclosed subject matter.
Figure 9:
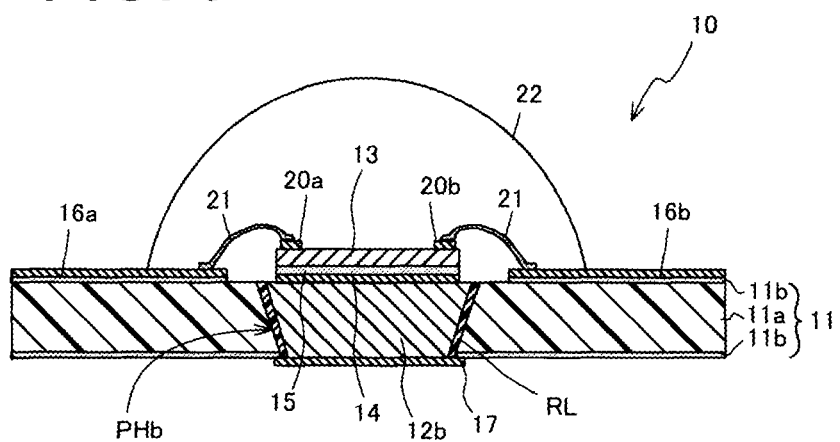
FIG. 9 is a schematic cross-sectional view of further another modification of the semiconductor light-emitting device according to the exemplary embodiment of the presently disclosed subject matter.

(4) The through hole PH may have a columnar shape or a frustum shape. The inner wall of the through hole PH is in contact with the resin layer RL. That is, in the light-emitting device described above, the cross-sectional shape perpendicular to the upper surface and the lower surface of the through hole PH of the substrate 11 can be a rectangle or a shape that widens or narrows from the upper surface to the lower surface. In the case of a through hole having a square cross section, the shape is easily formed, and a reduction in cost may be expected. In addition, the shape may conform to the shape of the metal core 12. As illustrated in FIG. 8, by forming the metal core 12 and the through hole PH in a frustum shape having the side surface of the same inclination angle, even when the cross-sectional shape of the through hole PHa is trapezoidal (downward expansion), or even when the cross-sectional shape of the through hole PHb is trapezoidal (upward expansion) as illustrated in FIG. 9, the distance between the metal core 12 and the substrate 11 becomes constant with the thickness of the resin layer RL, so that stress distortion due to thermal expansion of the resin layer RL hardly occurs.

Figure 10:
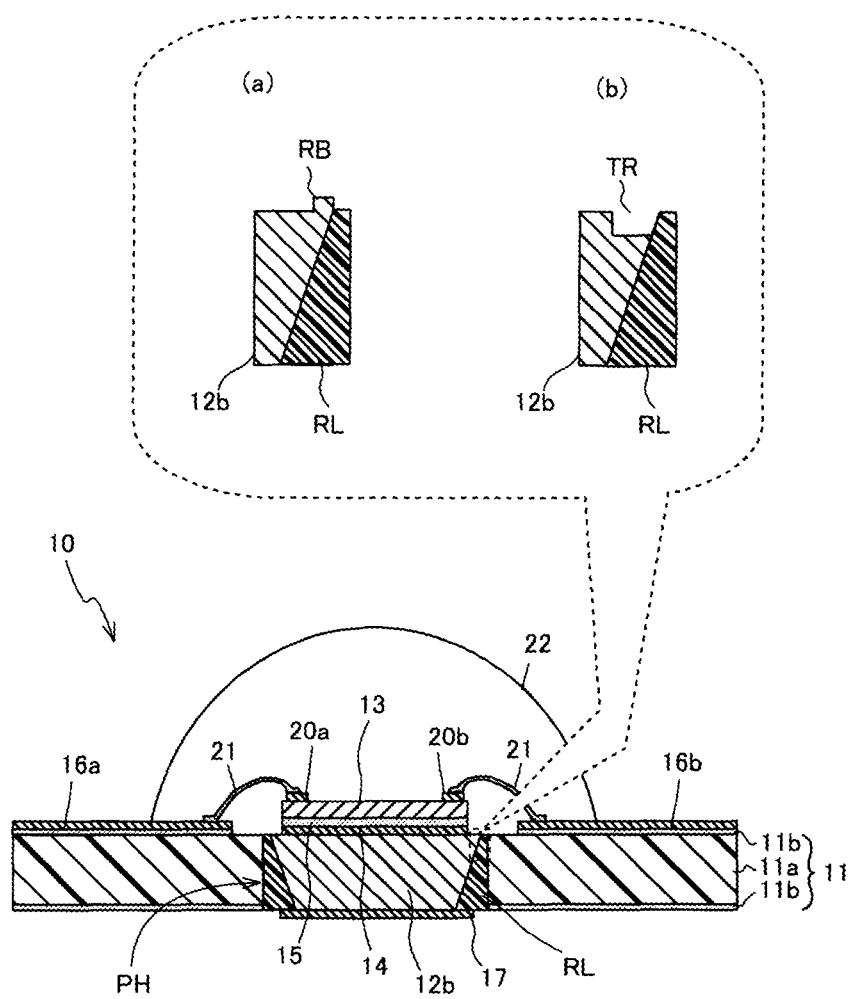
FIG. 10 is a schematic cross-sectional view of further another modification of the semiconductor light-emitting device according to the exemplary embodiment of the presently disclosed subject matter, including partial enlarged cross-sectional views of an edge portion and a resin layer on the upper surface of the metal core around the thermally-conductive film.

(5) The upper surface of the metal core 12b around the thermally-conductive film 14 when viewed from above may have a convex shape or a concave shape with respect to the horizontal direction of the substrate 11. For example, as illustrated in the partially enlarged cross-sectional view (a) in FIG. 10, the convex rib RB may be provided in an annular shape on the edge of the upper surface of the metal core 12b around the thermally-conductive film 14. In the case of the convex rib RB, although the thermal expansion of the substrate 11 and the resin layer RL is applied, since the strength of the edge portion of the metal core 12b is improved, stress breakdown due to the thermal expansion of the light-emitting element 13 is less likely to occur, thereby improving reliability. Further, as illustrated in the partially enlarged cross-sectional view (b) in FIG. 10, a concave groove TR may be annularly provided in an edge portion of the upper surface of the metal core 12b around the thermally-conductive film 14. In the case of the concave groove TR, even when the uncured adhesive supplied in the bonding step is excessive, the uncured adhesive can be retained in the concave groove TR. In (b) of FIG. 10, the concave groove is exposed on the outer peripheral surface of the metal core 12b, but the concave groove may be provided so as not to be exposed on the outer peripheral surface.

Figure 11:
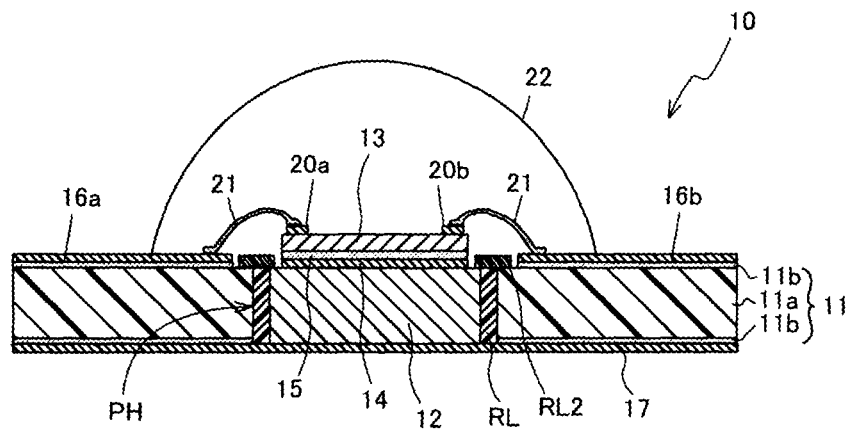
FIG. 11 is a schematic cross-sectional view of still further another modification of the semiconductor light-emitting device according to the exemplary embodiment of the presently disclosed subject matter.

(6) The upper surface of the metal core 12 around the thermally-conductive film 14 when viewed from above may be covered with a resist. That is, as illustrated in FIG. 11, the upper surface of the metal core 12 around the thermally-conductive film 14 may be annularly provided with a second resin layer RL2 overlying the upper surface. The resin layer RL2 can be provided so as to cover the resin layer RL and also the upper surface of the substrate 11. The resin layer RL2 is provided apart from all of the light-emitting element 13, the thermally-conductive film 14, and the adhesive layer 15. As illustrated, in FIG. 11, in the case of covering with the second resin layer RL2, the interface between the metal core 12, the resin layer RL, and the substrate 11 can be protected from peeling, and excessive plating can be eliminated in the pattern forming step. On the other hand, as illustrated in FIG. 2, when the second resin layer (resist) is not used for covering, a reduction in cost is expected because there is no resist.

Figure 12:
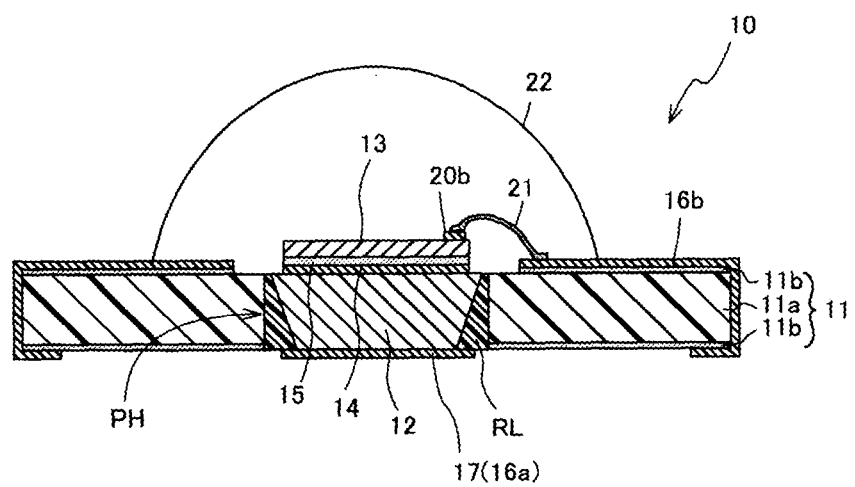
FIG. 12 is a schematic cross-sectional view of further another modification of the semiconductor light-emitting device according to the exemplary embodiment of the presently disclosed subject matter.

(7) As illustrated in FIG. 12, the light-emitting element 13 may be an element in which a pair of electrodes is provided on an upper surface (n-electrode) and a lower surface (p-electrode). In this case, one electrode (p-electrode) provided on the lower surface of the light-emitting element 13 is electrically connected to the heat dissipation film 17 (functioning as the p-connection electrode 16a) via the adhesive layer 15, the heat conduction film 14, and the metal core 12. The other electrode (n-electrode) provided on the upper surface of the light-emitting element 13 is connected to the n-connection electrode 16b on the substrate via a conductive wire 21.

(8) In the above-described embodiments and the modifications, the thickness of the metal core 12 is the same as the thickness of the base material 11a, but the presently disclosed subject matter is not limited thereto. The thickness of the metal core 12 may be the same as the thickness of the substrate 11.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art references described above are hereby incorporated in their entirety by reference.

What is claimed is:

1. A semiconductor light-emitting device comprising:
   a substrate having a through hole formed therein;
   a metal core which is fitted into the through hole formed in the substrate via a resin layer and penetrates through the substrate, the metal core having an upper flat surface;
   a thermally-conductive film which is formed in a region of the upper flat surface of the metal core, the thermally-conductive film having a flat surface; and
   a semiconductor light-emitting element which is bonded to the flat surface of the thermally-conductive film with an adhesive layer interposed therebetween, wherein
   an outer edge of the thermally-conductive film is separated from an outer edge of the upper flat surface of the metal core on which the thermally-conductive film is formed when viewed from a top view of the semiconductor light-emitting device, such that the upper flat surface of the metal core on which the thermally-conductive film is formed has a gap area on which the thermally-conductive film is not formed when viewed from the top view of the semiconductor light-emitting device.

2. The semiconductor light-emitting device according to claim 1, wherein the adhesive layer has an outer edge that is separated from the outer edge of the upper flat surface of the metal core.

3. The semiconductor light-emitting device according to claim 1, wherein the metal core has any of a columnar shape and a frustum shape, and a side surface in contact with the resin layer.

4. The semiconductor light-emitting device according to claim 2, wherein the metal core has any of a columnar shape and a frustum shape, and a side surface in contact with the resin layer.

5. The semiconductor light-emitting device according to claim 1, wherein the through hole formed in the substrate has a columnar shape or a frustum shape, and the through hole of the substrate has an inner surface in contact with the resin layer.

6. The semiconductor light-emitting device according to claim 2, wherein the through hole formed in the substrate has a columnar shape or a frustum shape, and the through hole of the substrate has an inner surface in contact with the resin layer.

7. The semiconductor light-emitting device according to claim 3, wherein the through hole formed in the substrate has a columnar shape or a frustum shape, and the through hole of the substrate has an inner surface in contact with the resin layer.

8. The semiconductor light-emitting device according to claim 4, wherein the through hole formed in the substrate has a columnar shape or a frustum shape, and the through hole of the substrate has an inner surface in contact with the resin layer.

9. The semiconductor light-emitting device according to claim 1, wherein the upper flat surface of the metal core around the thermally-conductive film has, on an edge thereof, any of an annular concave groove and an annular convex rib.

10. The semiconductor light-emitting device according to claim 2, wherein the upper flat surface of the metal core around the thermally-conductive film has, on an edge thereof, any of an annular concave groove and an annular convex rib.

11. The semiconductor light-emitting device according to claim 3, wherein the upper flat surface of the metal core around the thermally-conductive film has, on an edge thereof, any of an annular concave groove and an annular convex rib.

12. The semiconductor light-emitting device according to claim 4, wherein the upper flat surface of the metal core around the thermally-conductive film has, on an edge thereof, any of an annular concave groove and an annular convex rib.

13. The semiconductor light-emitting device according to claim 5, wherein the upper flat surface of the metal core around the thermally-conductive film has, on an edge thereof, any of an annular concave groove and an annular convex rib.

14. The semiconductor light-emitting device according to claim 6, wherein the upper flat surface of the metal core around the thermally-conductive film has, on an edge thereof, any of an annular concave groove and an annular convex rib.

15. The semiconductor light-emitting device according to claim 7, wherein the upper flat surface of the metal core around the thermally-conductive film has, on an edge thereof, any of an annular concave groove and an annular convex rib.

16. The semiconductor light-emitting device according to claim 8, wherein the upper flat surface of the metal core around the thermally-conductive film has, on an edge thereof, any of an annular concave groove and an annular convex rib.

17. A method for producing a semiconductor light-emitting device comprising:

a first step of forming a through hole in a substrate;

a second step of fitting and fixing a metal core to the through hole via a resin layer;

a third step of forming a thermally-conductive film in a region of an upper flat surface of the metal core, the thermally-conductive film having a flat surface; and a fourth step of bonding a semiconductor light-emitting element to the flat surface of the thermally-conductive film, wherein an outer edge of the thermally-conductive film is separated from an outer edge of the upper flat surface of the metal core on which the thermally-conductive film is formed when viewed from a top view of the semiconductor light-emitting device, such that the upper flat surface of the metal core on which the thermally-conductive film is formed has a gap area on which the thermally-conductive film is not formed when viewed from the top view of the semiconductor light-emitting device.

18. The semiconductor light-emitting device according to claim 1, wherein the gap area surrounds the thermally-conductive film when viewed from the top view of the semiconductor light-emitting device.

19. The semiconductor light-emitting device according to claim 18, wherein the gap area surrounds the thermally-conductive film entirely when viewed from the top view of the semiconductor light-emitting device.

* * * * *